(12) United States Patent
Gidon

(10) Patent No.: US 6,303,462 B1
(45) Date of Patent: Oct. 16, 2001

(54) PROCESS FOR PHYSICAL ISOLATION OF REGIONS OF A SUBSTRATE BOARD

(75) Inventor: Pierre Gidon, Echirolles (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/377,733

(22) Filed: Aug. 19, 1999

(30) Foreign Application Priority Data

Aug. 25, 1998 (FR) .................................................. 98 10687

(51) Int. Cl.$^7$ .................................................. H01L 21/76
(52) U.S. Cl. .......................... 438/406; 438/458; 438/424; 438/296
(58) Field of Search .................................. 438/454, 458, 438/406, 424, 296

(56) References Cited

U.S. PATENT DOCUMENTS

| 3,756,872 | * | 9/1973 | Goodman | ............................ 438/455 |
| 3,924,323 | * | 12/1975 | Trevail et al. | ....................... 438/455 |
| 4,612,408 | | 9/1986 | Moddel et al. . | |
| 5,064,771 | | 11/1991 | Solomon . | |

OTHER PUBLICATIONS

Loren A. Chow, et al., Mat. Res. Soc. Symp. Proc., vol. 476, pp. 105–110, "The Processing and Characterization of Hybrid Silica–Based Xerogel Films," 1997.

* cited by examiner

Primary Examiner—Trung Dang
(74) Attorney, Agent, or Firm—Oblon, Spivak, McClelland, Maier & Neustadt, P.C.

(57) ABSTRACT

Process for physical isolation of regions (110) of a substrate board (100) comprising the following steps:
  a) formation of trenches (106) in the substrate, delimiting regions of the substrate (110),
  b) placement of a liquid bonding material (120) in the trenches, which can solidify and bond to the substrate board (100) when in the solid state,
  c) solidification of the bonding material.

Application to isolation of electronic, optical, mechanical or magnetic components.

17 Claims, 6 Drawing Sheets

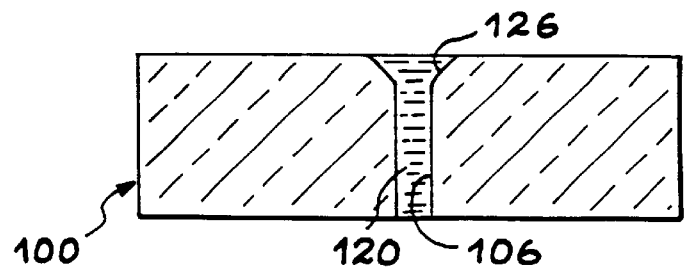
FIG. 2
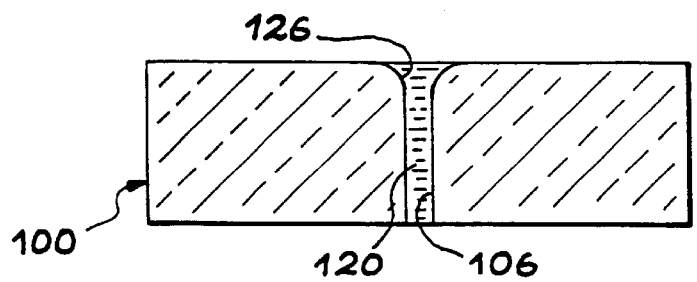
FIG. 3
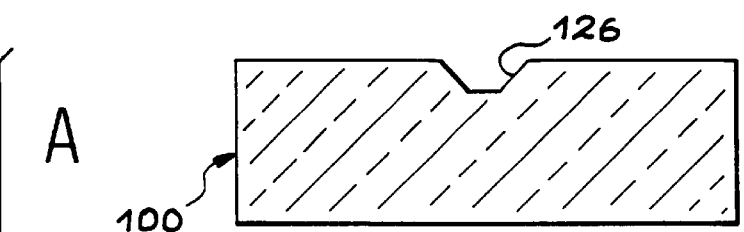
A
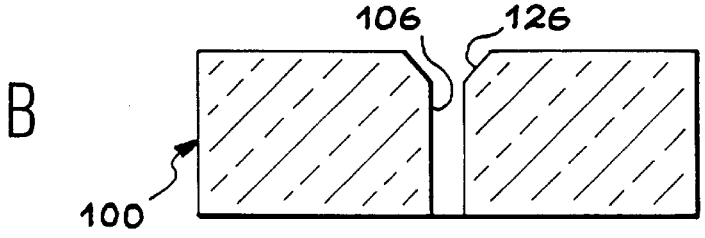
FIG. 4 { B
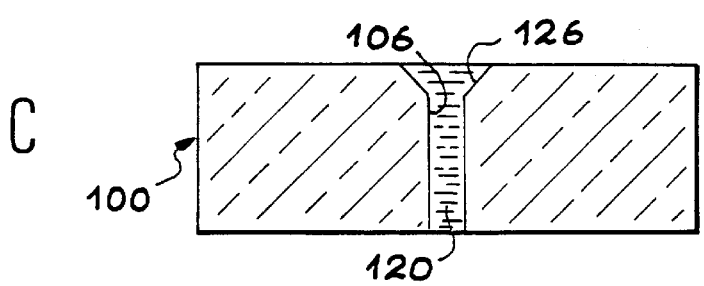
C

PROCESS FOR PHYSICAL ISOLATION OF REGIONS OF A SUBSTRATE BOARD

TECHNICAL DOMAIN

This invention relates to a process for preparation of a substrate board, and more precisely for the physical isolation of regions of a substrate board.

For the purposes of the invention, physical isolation of regions means a separation between the various regions to electrically and/or optically and/or magnetically and/or mechanically (particularly piezoelectrically) isolate the said regions.

The invention may be used in a very wide variety of applications in industry, depending on the isolation type planned.

For example, a semiconductor substrate board with electrically isolated regions may be used to make electronic components, and particularly power switching components.

In the same way, a substrate board comprising regions of transparent of double refraction material may be used for making wave guides, lenses or optical switches. Similarly, a substrate board comprising regions of piezoelectric or electro-optic materials may be used to make sensor or actuator matrices.

The invention may also be used in the mechanical or magnetic domain for integration of various sensors such as pressure, acceleration and magnetic field sensors, or other sensors.

STATE OF PRIOR ART

The manufacture of equipment in the integrated power electronics domain makes less and less use of discrete components formed throughout the thickness of a substrate board. Integration techniques specific to microelectronics are preferred, in which components and connections between components are formed on the surface of the substrate. These techniques are usually denoted by the term "Smart Power".

Special measures taken to provide sufficient electrical isolation between components makes modifications necessary to the form of components, and frequently complex preparations of integration supports.

Furthermore, isolation constraints are frequently contrary to the requirements of an increasingly dense integration.

Isolation of more traditional electronic components formed throughout the thickness of the support substrate also involves complex substrate preparation operations. For example, these operations include the diffusion of doping impurities in selected regions of the substrate to form potential barriers in it. They may also include the formation of dielectric barriers before components are made.

Component isolation problems also arise for optical circuits in which it is necessary to avoid any diffusion or propagation of parasite light between the various components.

Finally, complex magnetic or mechanical isolation precautions must be taken for the manufacture of magnetic or mechanical sensors or transducers.

The difficulties mentioned above are even worse when different categories of components are to be integrated on the same substrate board, if the components have different isolation requirements. For example, this is the case when microelectronics circuits and power electronics circuits, electronic circuits and optical circuits, or sensors, have to be combined with each other.

DESCRIPTION OF THE INVENTION

The purpose of this invention is to propose a process for physical isolation of regions with a substrate board without the difficulties mentioned above.

One purpose in particular is to propose this type of process for making an electrical, optical, mechanical and/or magnetic isolation according to the manufacturing requirements of the circuits considered.

Another purpose is to propose such a process particularly suitable for electronic power circuits capable of providing insulation at high voltages.

Another purpose is to propose an isolation system which is easy to use, which can be implemented during or after the placement of components in or on regions of the substrate board, and which is compatible with the constraints of large scale component integration.

In order to achieve these purposes, the purpose of the invention is more specifically a process for physical isolation of regions of a substrate board comprising the following steps:
  a) bonding of the substrate onto a support using an adhesive means that can be subsequently unbonded,
  b) formation of trenches delimiting regions of the substrate, in the substrate,
  c) placement of a liquid bonding material in the trenches, which can solidify and bond to the substrate board when in the solid state,
  d) solidification of the bonding material.

The choice of the bonding material may be adapted as a function of the required isolation type. In particular, for example, a dielectric material such as a polymer, a sol-gel or an epoxy may be selected to provide electrical insulation.

The trenches may be, but are not necessarily, through trenches. They are preferably formed by sawing, but may also be chemically etched or obtained by a combination of sawing and etching operations. The trenches may also be formed using other techniques such as laser cutting or water jet cutting techniques.

The support used in step a) efficiently maintains the cohesion of regions of the substrate board until the placement and solidification of the bonding material.

According to one particular embodiment of the invention, particularly applicable to insulation of electrical voltages between different regions of the substrate, flares may be formed on the surface of the substrate board to coincide with the trenches.

In particular, grooves with oblique sides forming the said flares may be formed in the substrate board.

The flares may be formed before or after the trenches, obviously provided that the end of the trenches coincides with the flares.

The flares may be formed at one or both ends of the trenches. They are formed at both ends particularly when electrical voltages between adjacent regions of the substrate could be reversed.

The flares at the two ends of the trenches may be made using the following operational steps, in sequence:
  form first grooves with flared sides on a first face of the substrate board,
  form first non-through trenches in the board starting from the first face, coinciding with the first grooves,
  apply a coat of bonding material on the first trenches,
  separate the substrate and the support,
  form second grooves with flared edges on the second face of the substrate board, opposite the said first face, the two grooves being collinear with the first grooves, form second trenches leading into the first trenches from the second face, coinciding with the second grooves, apply a coat of bonding material on the second grooves.

Applying a coat of bonding material means placement and solidification of the bonding material.

In order to adapt the isolation to the type of components being made in the various regions of the substrate board, the surface of the trenches can be lined with a suitable coating before placing the bonding material.

For example, for a better distribution of the electric field, the trench sides could be coated with a thin coat of material with a given electrical conductivity.

In one use of the substrate to make optical components, the sides may be lined with a metal coat forming a mirror, or a dielectric multi-layer structure forming an optical anti-reflection coating.

The invention also relates to the use of a substrate board according to the process described above for the manufacture of strips or matrices of diodes or transistors insulated from each other, or for the manufacture of strips or matrices of electronic circuits electrically insulated from each other, or for the manufacture of a component made of diodes and/or transistors and/or electronic circuits and/or sensors or actuators isolated from each other.

Other characteristics and advantages of the invention will become more obvious from the following description with reference to the figures in the attached drawings. This description is given for illustrative purposes only and is in no way restrictive.

BRIEF DESCRIPTION OF THE FIGURES

Parts A to E in FIG. 1 show diagrammatic sections through a substrate board and illustrate the various steps in a particular implementation of the process according to the invention.

FIGS. 2 and 3 show a detail through a section of a substrate board, illustrating possible shapes of the isolating trenches.

Parts A to C in FIG. 4 are sections through a detail of a substrate board and illustrate successive steps in making a trench and applying a lining to it, in accordance with one possible particular embodiment of the process according to the invention.

Figure 5:
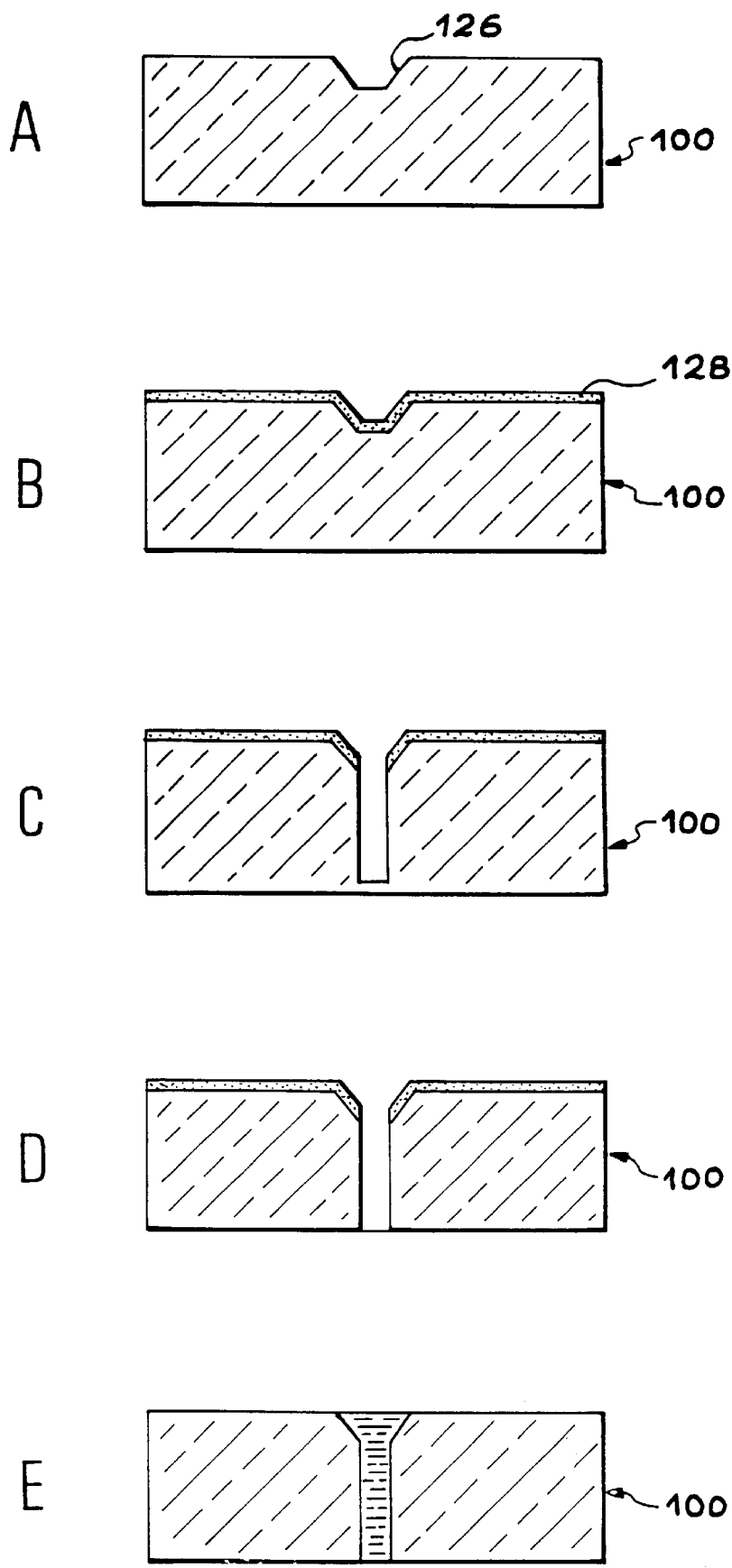

Parts A to E in FIG. 5 are sections through a detail of a substrate board and illustrate the various steps in making a trench and applying a lining to it, in accordance with another possible particular embodiment of the process according to the invention.

Figure 6:
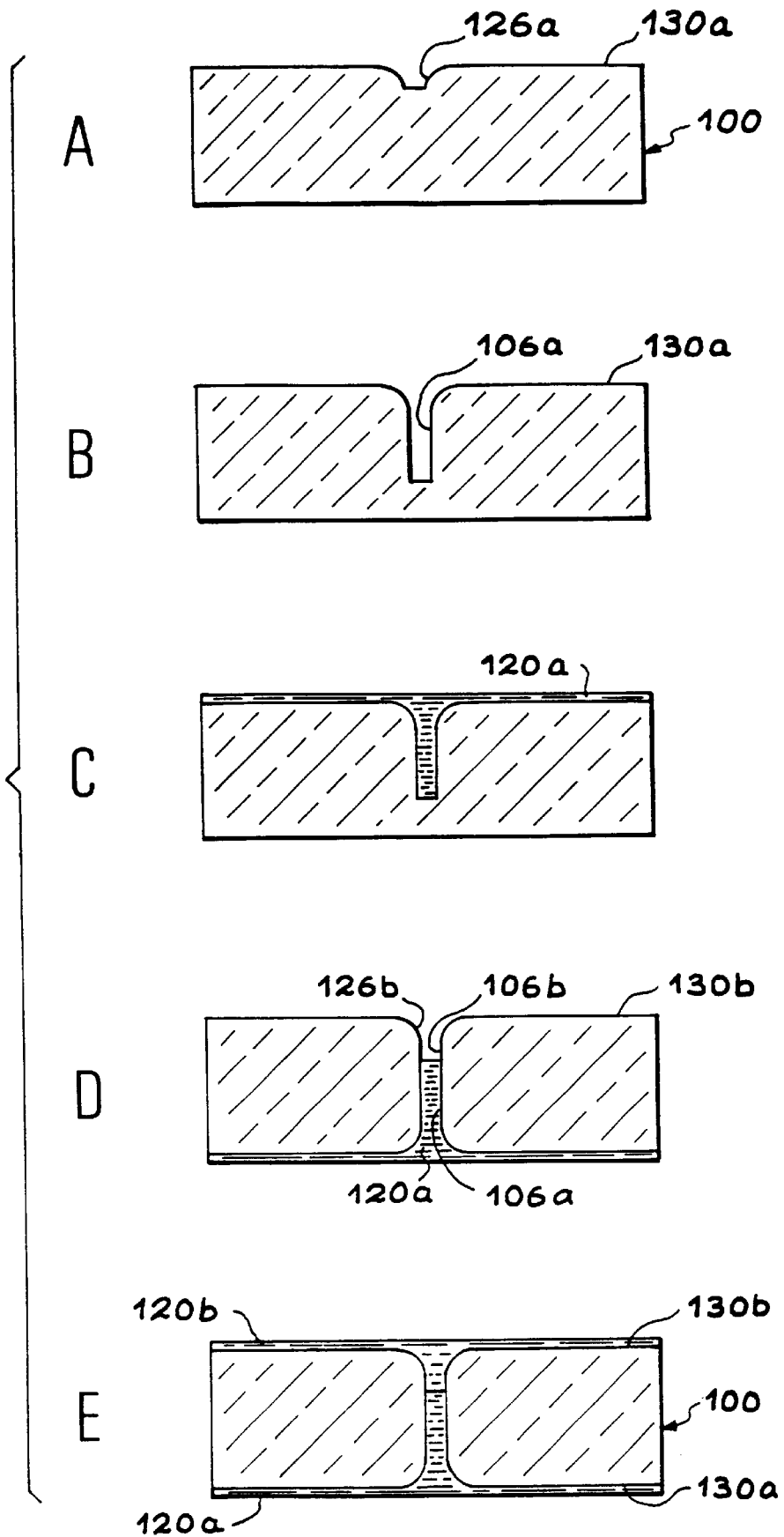
Figure 6:
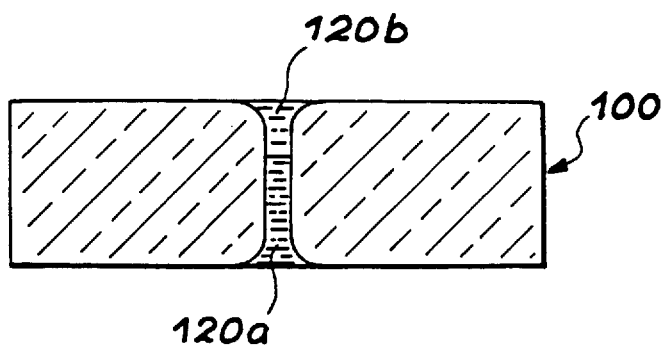

Parts A to F in FIG. 6 are sections through a detail of a substrate board and illustrate the various steps in making a trench and applying a lining to it, in accordance with yet another possible particular embodiment of the process according to the invention.

Figure 7:
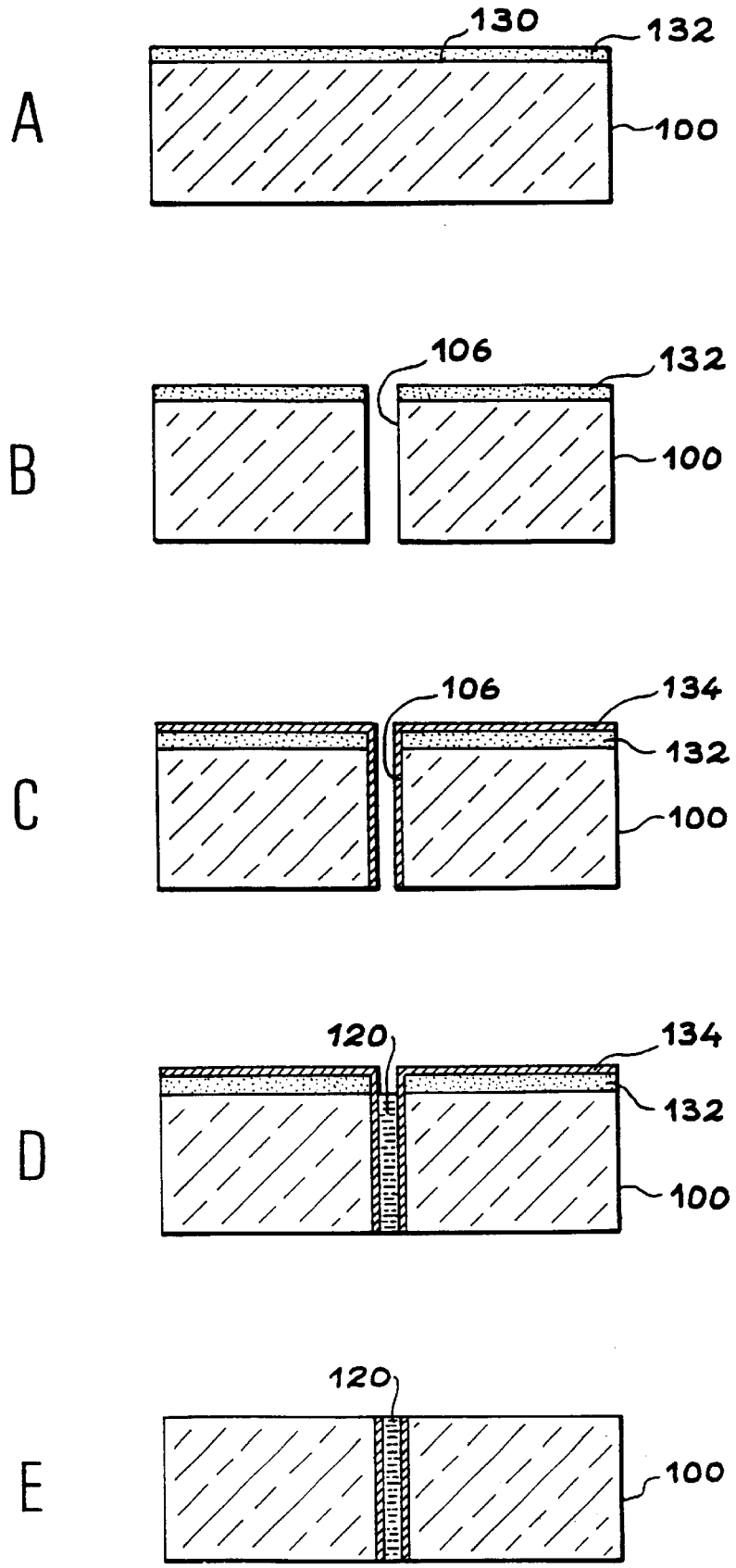

Parts A to E in FIG. 7 are diagrammatic sections through a substrate board and illustrate one possible improvement to the process according to the invention.

Figure 8:
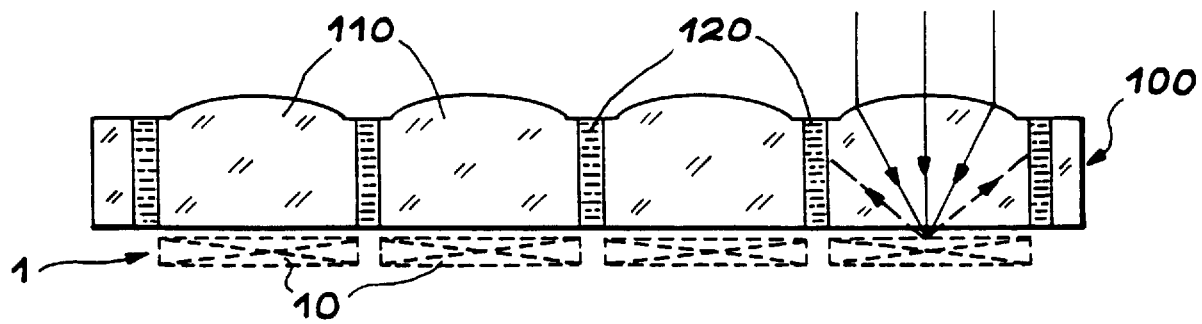

FIG. 8 is a section through a substrate board treated according to the invention and illustrates an application of this board in the micro-optics domain.

Figure 9:
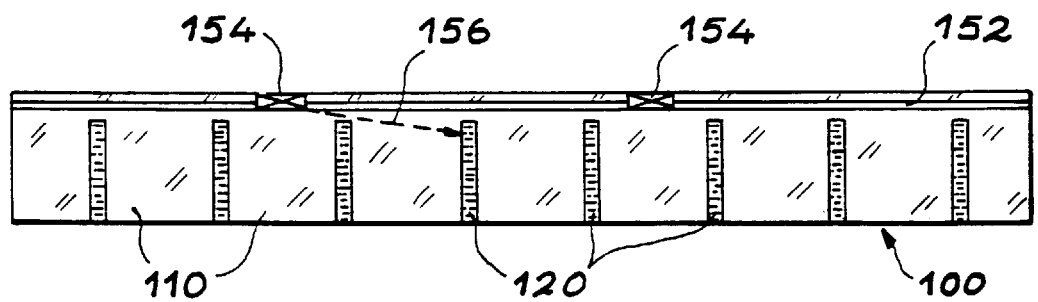

FIG. 9 is a section through a substrate board treated in accordance with the invention and illustrates an application of this board in the guided optics domain.

DETAILED DESCRIPTION OF EMBODIMENTS OF THE INVENTION

Identical, similar or equivalent parts shown in the figures and mentioned in the following description are identified by the same references, for simplification reasons.

Figure 1:
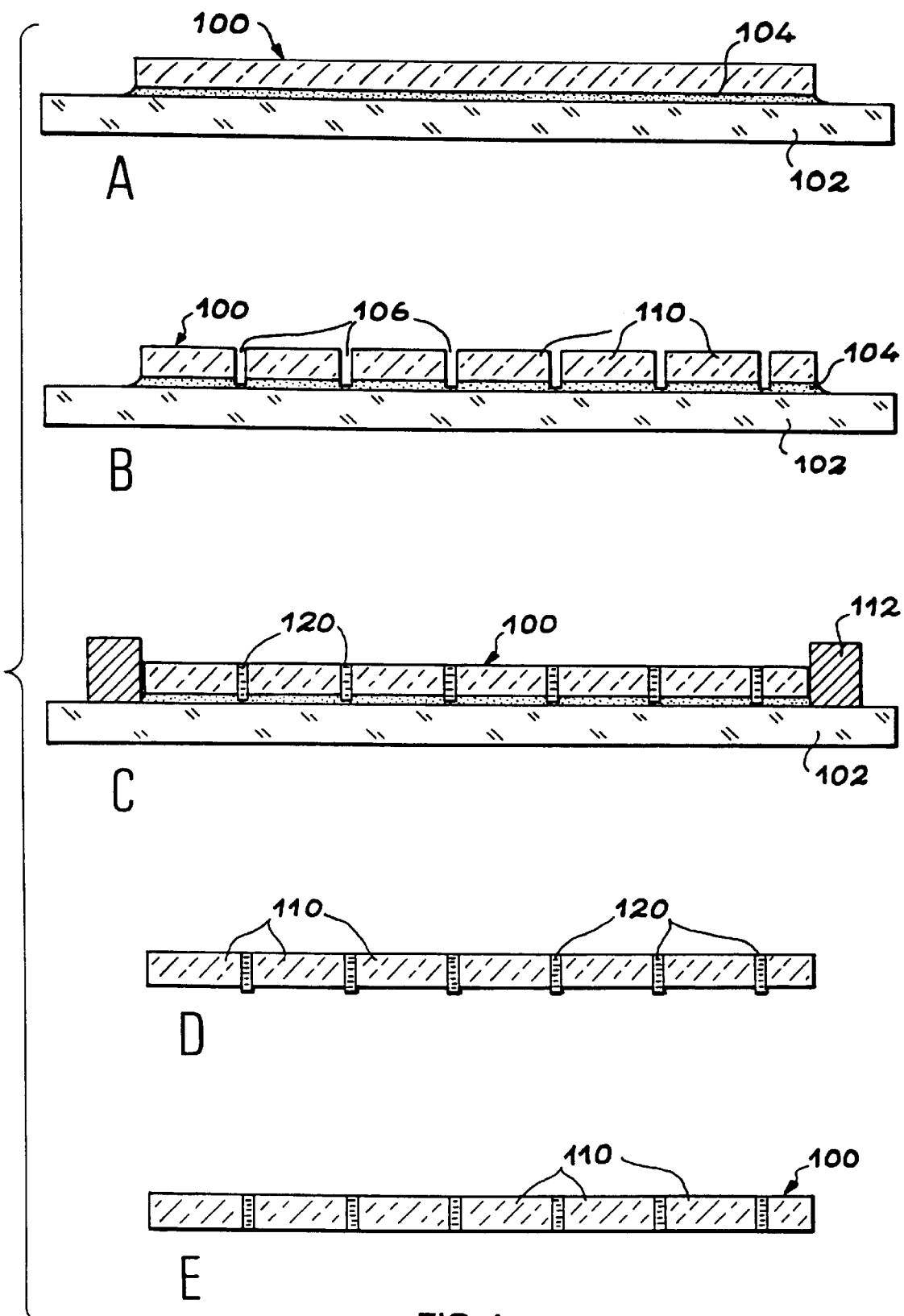

FIG. 1 shows a particular embodiment of the process according to the invention.

In a first step corresponding to part A in the figure, a substrate wafer 100, for example such as a silicon wafer, is fixed on a support 102 such a glass or metal plate by means of a bonding layer 104. In a preferred manner, the support material 102 may be chosen to be identical to the substrate material 100. This avoids some problems, since the coefficients of expansion are the same. In particular, the material used for support 102 may be silicon when the substrate 100 is a silicon wafer.

For example, the bond layer 104 may be a coat of wax or resin enabling reversible bonding. In the case of a wax coat, subsequent separation may easily be provoked by increasing the temperature of the bond layer by a few tens of degrees. A layer of resin may be eliminated using an appropriate solvent.

The diameter of the substrate wafer may vary from a few centimeters to several decimeters and its thickness may be of the order of 100 $\mu$m to several millimeters. There may be components manufactured in advance on it, or it may have no components on it, which is the case shown in the figure.

After placing the wafer 100 on the support 102, it is sawn to form notches on the wafer, referred to as trenches in the rest of this text. Several trenches may be formed simultaneously by using a saw with several blades.

As shown in part B in FIG. 1, the trenches 106 in the example described pass through the substrate wafer 100 from one side to the other.

The trenches are made either at a regular pitch, or simply along directions and at distances determined in advance as a function of the components to be made on the substrate.

For example the width of the trenches 106 may vary from a few tens to a few hundreds of micrometers.

The width of the trenches may be adjusted either by modifying the thickness of the blades used for sawing, or by carrying out a variable number of successive passes of the same blade, slightly offset each time.

It can be seen that the trenches delimit regions of the substrate 110, within the substrate 100. These regions will be used for subsequent manufacture of components.

In one particular embodiment of the invention in which components are made before the trenches are formed, areas without components are provided on the surface of the substrate in which the trenches will be formed.

Part C in FIG. 1 shows the placement of a border 112 around the substrate board. In the example described, the substrate board is in the form of a disk and the border consists of a single ring, the inside diameter being adjusted to suit the diameter of the substrate board.

The border 112 forms a tray with the wafer 100, in which can retain a liquid bonding material which will solidify and bond to the wafer.

The bonding material reference 120 in FIG. 1 fills the trenches 106. This material is initially in liquid form, and the quantity used is preferably such that the liquid surface is just flush with the free surface of the substrate board, without overflowing onto it. Depending on the viscosity of the liquid used, its placement in the trenches may be facilitated by vibrating the support 102, for example by ultrasounds.

The surface of the ring forming the border 112 is preferably made of a material such as teflon, to which the bonding material does not bond as it solidifies.

Depending on the bonding material used, it may solidify for example by cross-linking or polymerization caused by heating or UV insolation, by chemical catalysis or by the evaporation of a solvent contained in the material.

After solidification, the bond layer 104 is heated and eliminated in order to separate the substrate board 100 from the support 102.

It can be seen on part D in FIG. 1 that the regions of the substrate board are now mutually isolated by the bonding material 120. Furthermore, the bonding material forms the mechanical cohesion of the board by keeping the regions of the substrate 110 in contact with each other.

It will also be seen that the bonding material projects slightly onto the surface of the substrate wafer initially bonded to the support. This is due to he fact that the through trenches formed in the substrate projected slightly into the bonding layer, due to the inaccuracy of sawing.

Deburring, possibly followed by slight polishing, can produce a perfectly plane substrate board 100 in the same plane as the physically isolated regions of the substrate 110, as shown on part E in FIG. 1.

Note that the process for preparation of the substrate board did not modify the shape of the board, consequently its dimensions are the same as standard equipment. Therefore, it may be used in a conventional manner to make components in the regions.

Furthermore, heat treatments used particularly to release the board from its support, are low temperature treatments and therefore will not damage components previously formed in the substrate board.

In applications of the process to electrical insulation of regions of the substrate, it is found that the thickness of the bonding material in the trenches needs to be increased in order to obtain a high voltage withstand between the different regions.

However, it is desirable to minimize the width of the trenches in order to improve efficiency and for manufacturing cost reasons.

A compromise between these two constraints may beneficially be found by shaping the trenches as shown in FIGS. 2 and 3.

According to these figures, the trenches 104 are equipped with a flare 126 at their end opening onto the surface of the substrate board. The flare makes it possible to further increase the distance between the edges of the substrate board on each side of the trenches, and prevent an electrical discharge through these edges which tend to concentrate electrical fields.

Preferably, the angles at the end of the trench are made as obtuse as possible as shown in FIG. 2 or are rounded as shown in FIG. 3.

The flare in FIG. 2 is in the form of a chamfer. This type of chamfer may be made by a shaped saw, in which the profile of the blade determines the shape of the cut.

As a variant, a flare conform with FIG. 3 may also be obtained by etching. For example a resin etching mask can be formed on the surface of the substrate board, and except for the trenches, the mask is made to creep and an anisotropic etching is carried out.

The voltage withstand of the bonding material may also be increased by smoothing the sides of the trenches.

This smoothing may be done by passing the saw blade a second time, or by the use of another finer grained blade in the trenches before placing the bonding material. It eliminates spots or rough edges on the sides of the trenches that could concentrate the electrical field on each side of the trench between different regions in the substrate.

The flares or chambers formed at the end of the trenches may be made before or after the trenches themselves. One example embodiment is shown in FIG. 4.

Part A in FIG. 4 shows the formation of a groove 126 on one face of the substrate board 100. The groove 126 is formed by sawing with an oblique edged blade in order to obtain a chamfer, by cutting off the sharp edge of the groove.

Part B in FIG. 4 shows how trench 106 is sawn, to coincide with the groove such that the trench opens up into the chamfered groove. The width of the trench is less than the width of the flared part of the groove 126. Finally, the bonding material 120 is added into the trench so as to fill it, including in its upper part formed by the groove. This latter step corresponds to part C in FIG. 4.

FIG. 5 shows a variant embodiment of the process in which the trenches are made by sawing and by etching.

A first step, illustrated by part A in FIG. 5 consists of forming a groove 126 in the substrate. This operation, already described with reference to part A in FIG. 4, is not described again here. However, note that this step may be omitted when the bonding material is not designed to resist high voltages.

A second step, illustrated by part B in FIG. 5, consists of applying a mask layer 128 onto the surface of the substrate in which a groove 126 is formed. The mask layer extends into the said groove. For example, it may be a layer of resin.

Sawing the trench, illustrated by part C in FIG. 5, eliminates the mask at the bottom of the groove. Note that sawing is done such that the trench 106 obtained does not pass through the board, but stops a short distance from the opposite face, while leaving a small amount of material. The thickness of the remaining material may be of the order of 10 $\mu$m, for example. It avoids passing the saw beyond the substrate board.

The trench 106 is completed by dry anisotropic etching of the remaining material left after sawing. During this etching, the mask 128 preserves the surface of the substrate.

In particular, etching stops the trench in a sharper manner than sawing.

This operation corresponds to part D in FIG. 5.

A final step, illustrated by part E in FIG. 5, consists of eliminating the mask and applying a lining in the trench as described above.

FIG. 6 shows another variant embodiment of the process for isolation of regions of a substrate that could be subject to voltage inversions. In this variant, the sharp edges of the trenches are eliminated on both sides of the substrate board.

A first step illustrated by part A in FIG. 6 consists of forming a first flared-shaped groove 126a in a first face 130a of the substrate. The edges of the groove are rounded in the example shown.

As shown on part B in FIG. 6, this step is followed by sawing a first non-through segment of trench 106a, coincident with the groove.

The trench 106a is filled with bonding material 120a that is allowed to overflow onto the first face 130a in order to passivate it. This operation is shown on part C in FIG. 6.

The substrate is then turned over, as shown on part D in FIG. 6. A groove 126b and a segment of trench 106b are formed in a second face 130b of the substrate, opposite the first face 130a, to coincide with the first segment 106a. The second segment 106b of the trench extends as far as the bonding material 120a located in the first segment of the trench.

The second segment 106b of the trench is also filled with a bonding material 120b that spreads onto the second face 130b. The result is the substrate wafer shown on part E in FIG. 6.

Part F in FIG. 6 shows the same substrate wafer for which the bonding material 120a, 120b does not spread onto the substrate faces 130a, 130b.

For example, this type of wafer may be obtained by stripping faces 130a, 130b of the wafer shown on part E.

FIG. 7 shows a particular embodiment of the process according to the invention, for example by which particular optical isolation or electrical insulation properties may be assigned to the trenches.

A first step illustrated by part A in the figure consists of the formation of a protective layer 132 on a face 130 of a substrate wafer 100.

For example, the protective layer may be a resin or another material that can be eliminated by a selective chemical etching.

A second step illustrated by part B in FIG. 7, consists of forming a trench 106, as already described with reference to FIGS. 2 to 6.

A third step, illustrated by part C in FIG. 7, consists of depositing one or several layers 134 of the lining material that cover the free surface of the protective layer and the sides of the trench.

The layer 134 may be a layer of material with a controlled resistivity for electronics applications.

For optical applications, the layer 134 could be a layer of reflecting material or it may formed of a dielectric multi-layer structure with anti-reflection properties.

In general, layer 134 is intended to assign particular physical properties to trenches depending on the type of isolation required between different regions of the substrate.

The next step, illustrated by part D in FIG. 7, consists of placing the bonding material in the trench.

Finally, the last step illustrated by part E in FIG. 7, consists of eliminating the protective layer and the part of the layer of lining material 134 that projects outside the trench. The protective layer may be eliminated by chemical etching and the lining layer 134 is eliminated automatically by lift-off.

During preparation of a substrate wafer, on which different categories of components will be fitted, it is possible to equip trenches with different lining layers corresponding to the different isolation needs dictated by each category of components.

Descriptions for FIGS. 2 to 7 are specifically related to a single trench for reasons of clarity. However, note that many trenches could be formed simultaneously in one substrate board, for example in the form of an orthogonal network to isolate several regions in the substrate.

FIG. 8 shows a particular application of the invention in the micro-optics domain.

A set of microlenses laid out in the form of a matrix is composed of regions 110 of a substrate 100 made of a material transparent to light. The upper surface 130 of each region 110 is curved, to give it its lens properties. In the example described, the set of microlenses is associated with matrix 1 of detectors, in which each detector 10 is associated with a region 110, in other words with one of the microlenses.

The bonding material 120 used to line the trenches is an opaque absorbent material used to eliminate parasite light diffused on detectors 10.

FIG. 9 shows another application of the invention in the domain of guided optics.

This application also uses a substrate 100 made of a material transparent to light, but the trenches do not pass through the wafer but only pass through part of the thickness of the wafer. The trenches are filled with an opaque bonding material 120 which prevents the propagation of light. The trenches thus form optical isolation barriers similar to diaphragms. The part of the substrate in which there are no trenches, called the superstrate, is identified as reference 150.

An optical guide 152 which joins the optical components 154 to each other is formed in the superstrate 150. For example, these components may be mirrors, networks or optical dividers.

When a light wave passes through components 154, optical losses occur shown in the figure diagrammatically in the form of a light ray 156.

In conventional guided optics devices, the sum of the optical losses can produce background noise that is a nuisance for complex optical components.

When a substrate according to FIG. 9 is used with optical isolation (diaphragms) between the various regions, light due to optical losses can be stopped resulting in a better signal to noise ratio for the components.

What is claimed is:

1. Process for physical isolation of regions of a substrate board comprising the following steps:
   (a) bonding the substrate onto a support using an adhesive means that can be subsequently unbonded;
   (b) forming trenches in the substrate in order to delimit regions of the substrate,;
   (c) smoothing the sides of the trenches;
   (d) placing a liquid bonding material in the trenches which has properties which enable it to bond to the substrate board when in a solid state; and
   (e) solidifying the liquid bonding material.

2. Process according to claim 1, further comprising after step (e) the step of:
   separating the substrate and the support by unbonding.

3. Process according to claim 1 or 2, wherein the trenches are formed by sawing.

4. Process according to claim 1 or 2, wherein the bonding material is a dielectric material.

5. Process according to claim 4, wherein the dielectric bonding material is a polymer, sol-gel, or epoxy material.

6. Process according to claim 1, further comprising the step of:
   forming a removable border around the wafer made of a material to which the bonding material will not bond in order to form a reception tray for the bonding material.

7. Process according to claim 1, further comprising after step (c) a step of:
   deburring the bonding material that projects outside the trenches.

8. Process according to claim 1, further comprising, prior to step (d), the step of:

forming at least one flare at at least one end of the trenches.

9. Process according to claim 8, wherein grooves with oblique sides are made to form the flares.

10. Process according to claim 8, wherein the flares are formed by etching or sawing.

11. Process according to claim 8, wherein the flares are formed before the trenches are formed.

12. Process according to claim 8, wherein the flares are formed after the trenches are formed.

13. Process according to claim 8, wherein the flares are formed at each end of the trenches on two opposite faces of the substrate board.

14. Process according to claim 13, further comprising the following steps:

(a) forming first grooves with flared sides on a first face of the substrate board;

(b) forming first non-through trenches in the board starting from the first face, coinciding with the first grooves;

(c) applying a coat of bonding material on the first trenches;

(d) separating the substrate and the support;

(e) forming second grooves with flared edges on a second face of the substrate board, opposite the said first face, the two grooves being collinear with the first grooves;

(f) forming second trenches starting from the second face coinciding with the second grooves and leading into the first trenches; and (g) applying a coat of bonding material on the second grooves.

15. Process according to claim 1, wherein the sides of the trenches are lined with a coating before the bonding material is placed in the trenches.

16. Process according to claim 15, wherein the coating is a coat of electrically conducting material.

17. Process according to claim 16, wherein the coating is a multi-layer optical coat.

* * * * *